(12) United States Patent
Lin et al.

(10) Patent No.: US 8,055,373 B2
(45) Date of Patent: Nov. 8, 2011

(54) AUTOMATIC WAFER STORAGE SYSTEM AND A METHOD FOR CONTROLLING THE SYSTEM

(75) Inventors: Huan-Cheng Lin, Taipei County (TW); Jung-Pin Lai, Taipei County (TW)

(73) Assignee: Inotera Memories, Inc., Taoyuan County (TW)

( * ) Notice: Subject to any disclaimer, the term of this patent is extended or adjusted under 35 U.S.C. 154(b) by 285 days.

(21) Appl. No.: 12/415,108

(22) Filed: Mar. 31, 2009

(65) Prior Publication Data

US 2010/0074718 A1  Mar. 25, 2010

(30) Foreign Application Priority Data

Sep. 24, 2008 (TW) .............................. 97136604 A

(51) Int. Cl.
- G06F 19/00 (2011.01)
- G06F 7/00 (2006.01)
- G01N 37/00 (2006.01)
- B65F 1/00 (2006.01)

(52) U.S. Cl. ............ 700/112; 700/95; 700/96; 700/116; 700/220; 700/221; 700/222; 702/84; 414/373

(58) Field of Classification Search ............ 700/95, 700/96, 112, 116, 228–230; 414/373; 702/84
See application file for complete search history.

(56) References Cited

U.S. PATENT DOCUMENTS

| | | | | |
|---|---|---|---|---|
| 3,902,615 A * | 9/1975 | Levy et al. | ............... | 414/331.17 |
| 4,564,102 A * | 1/1986 | Mori et al. | ............... | 198/341.03 |
| 4,618,938 A * | 10/1986 | Sandland et al. | ............. | 382/148 |
| 4,654,512 A * | 3/1987 | Gardosi | ......................... | 235/376 |
| 5,050,088 A * | 9/1991 | Buckler et al. | ................... | 700/96 |
| 5,838,566 A * | 11/1998 | Conboy et al. | ................ | 700/115 |
| 6,076,652 A * | 6/2000 | Head, III | ................... | 198/341.07 |
| 6,351,684 B1 * | 2/2002 | Shirley et al. | ................. | 700/121 |
| 6,398,476 B1 * | 6/2002 | Ando | ............................ | 414/282 |
| 6,457,587 B1 * | 10/2002 | Conboy et al. | ................. | 209/630 |
| 6,625,556 B1 * | 9/2003 | Conboy et al. | ................... | 702/84 |
| 6,687,986 B2 * | 2/2004 | White | ............................. | 29/832 |
| 6,990,721 B2 * | 1/2006 | Mariano et al. | ................. | 29/469 |
| 7,076,326 B2 * | 7/2006 | Wu et al. | ....................... | 700/213 |
| 7,289,867 B1 * | 10/2007 | Markle et al. | .................. | 700/121 |
| 7,302,307 B1 * | 11/2007 | Anderson et al. | ............. | 700/121 |
| 7,457,680 B2 * | 11/2008 | Akiyama et al. | .............. | 700/112 |
| 7,720,560 B2 * | 5/2010 | Menser et al. | ................. | 700/121 |
| 2001/0023377 A1 * | 9/2001 | Wehrung et al. | ............... | 700/230 |
| 2002/0064442 A1 * | 5/2002 | Ahn et al. | ...................... | 414/373 |
| 2004/0109746 A1 * | 6/2004 | Suzuki | .......................... | 414/373 |
| 2006/0257233 A1 * | 11/2006 | Bonora et al. | ................ | 414/217 |
| 2007/0274810 A1 * | 11/2007 | Holtkamp et al. | ............ | 414/217 |
| 2009/0114507 A1 * | 5/2009 | Kitazumi et al. | ........ | 198/370.09 |

OTHER PUBLICATIONS

Watanabe et al., "High Speed AMHS and its Operation Method for 300mm QATA-Fab", IEEE, 2003, p. 25-28.*

* cited by examiner

Primary Examiner — Albert Decady
Assistant Examiner — Thomas Stevens
(74) Attorney, Agent, or Firm — Rosenberg, Klein & Lee

(57) ABSTRACT

An automatic wafer storage system and a method of controlling the system are disclosed. The automatic wafer storage system includes an analysis module and a storage unit. The analysis module estimates the locations between an idle equipment, a transport tool, and the storage unit, so as to control the storage unit and the transport tool to move to the best location for the transport tool to receive wafers from the storage unit. After that, the transport tool carries the wafers to the idle equipment for processing.

16 Claims, 5 Drawing Sheets

AUTOMATIC WAFER STORAGE SYSTEM AND A METHOD FOR CONTROLLING THE SYSTEM

BACKGROUND OF THE INVENTION

1. Field of the Invention

The present invention relates to a transport system and a method for controlling the system, in particular to an automatic wafer storage system and a method for controlling the system.

2. Description of Related Art

In recent years, Automated Material Handling System (AMHS) is commonly used in the semi-conductor manufacturing factory. The Automated Material Handling System is for transporting wafers to a manufacturing tool for processing. But the number of manufacturing tools (i.e. equipments) may be limited. Therefore, when a wafer has been processed in an equipment, the Automated Material Handling System may first transport the wafer to a buffer station to be stored for a while. After the next equipment has processed the prior wafer, the Automated Material Handling System transport the wafer from the buffer station to the now available equipment for a next process.

Though the Automated Material Handling System is commonly utilized, it still has defects as follows:

1. If the buffer station is not disposed near the equipment, the transport tool of the Automated Material Handling System may waste a substantial amount of time to transport a wafer from the buffer station to the equipment.

2. The movement of the transport tool of the Automated Material Handling System is along one direction. Therefore, if the transport tool does not locate the equipment precisely, the transport tool needs to move around the entire track of the Automated Material Handling System so as to loop back again in order to relocate the equipment.

3. The buffer station is only for storing without other functions, so that wafers need to wait for the transport tool to come, which wastes a lot of time.

Therefore, it is necessary to design a transport system and a method of controlling the system so as to overcome the above-mentioned problems.

SUMMARY OF THE INVENTION

The primary object of the present invention is to provide an automatic wafer storage system. Where wafers are stored in the system is a buffer station before processing. The automatic wafer storage system estimates the locations of an equipment and a transport tool by an analysis means. Through an analysis module and a storage unit, the automatic wafer storage system would find and move the storage unit to the best location to wait for the transport tool to pick up or drop off a wafer. Thereby the time spent waiting for the transport tool is reduced. At the same time, the waste time resulting from location differences between the wafer and the equipment is reduced too, since the analysis module analyze the location between an idle equipment (i.e. the tool to process the wafer), a transport tool (the tool to transport the wafer), and the storage unit (the buffer station that is now mobile and so may move to the optimum location as indicated by the analysis module).

The second object of the present invention is to provide a method for controlling an automatic wafer storage system. The method makes an equipment, a transport tool, and the storage unit cooperate with each other according to their relative locations. Thereby, wafer will be transported to an idle equipment to process quickly. The idle time of the equipment is reduced and the yield is improved.

In order to achieve the above object, the present invention provides an automatic wafer storage system. The automatic wafer storage system is used in a transport system of a semiconductor manufacturing factory. The transport system comprises at least one belt and at least one transport tool. The transport tool moves along the belt in one direction so as to carry wafers to an idle equipment for processing. The automatic wafer storage system includes an analysis module which is electrically connected with the transport system and the equipment; the analysis module can estimate the locations of the transport tool and the idle equipment, and then send out a transport order, at least one storage unit for storing wafers is disposed movably along the belt and electrically connected with the analysis module. The storage unit receives the transport order and moves to the best location. At the same time, the transport tool moves to the best location to carry the wafers stored in the storage unit to the idle equipment for processing.

The present invention further provides a method for controlling an automatic wafer storage system. The automatic wafer storage system is used in a transport system of a semiconductor manufacturing factory to transport wafers to an idle equipment. The transport system comprises at least one belt and at least one transport tool. The automatic wafer storage system comprises an analysis module and a storage unit. The steps of controlling the automatic wafer storage system are as follows:

The analysis module estimates the relative locations of the transport tool, the idle equipment, and the storage unit. A first location information is generated from the analysis module according to the relative locations of the transport tool, the idle equipment, and the storage unit for controlling the storage unit to move to the best location. The transport tool also moves to the best location at the same time. The storage unit transports wafers to the transport tool. The transport tool carries the wafers to the idle equipment for processing. Or a second location information is generated from the analysis module according the relative locations of the transport tool, idle equipment, and the storage unit for limiting the storage unit movement. The transport also moves to the location of the storage unit at the same time. The storage unit transports wafers stored therein to the transport tool. The transport tool then carries the wafers to the idle equipment for processing.

For further understanding of the present invention, reference is made to the following detailed description illustrating the embodiments and examples of the present invention. The description is for illustrative purpose only and is not intended to limit the scope of the claim.

BRIEF DESCRIPTION OF THE DRAWINGS

The drawings included herein provide a further understanding of the present invention. A brief introduction of the drawings is as follows.

DETAILED DESCRIPTION OF THE PREFERRED EMBODIMENTS

Figure 1:
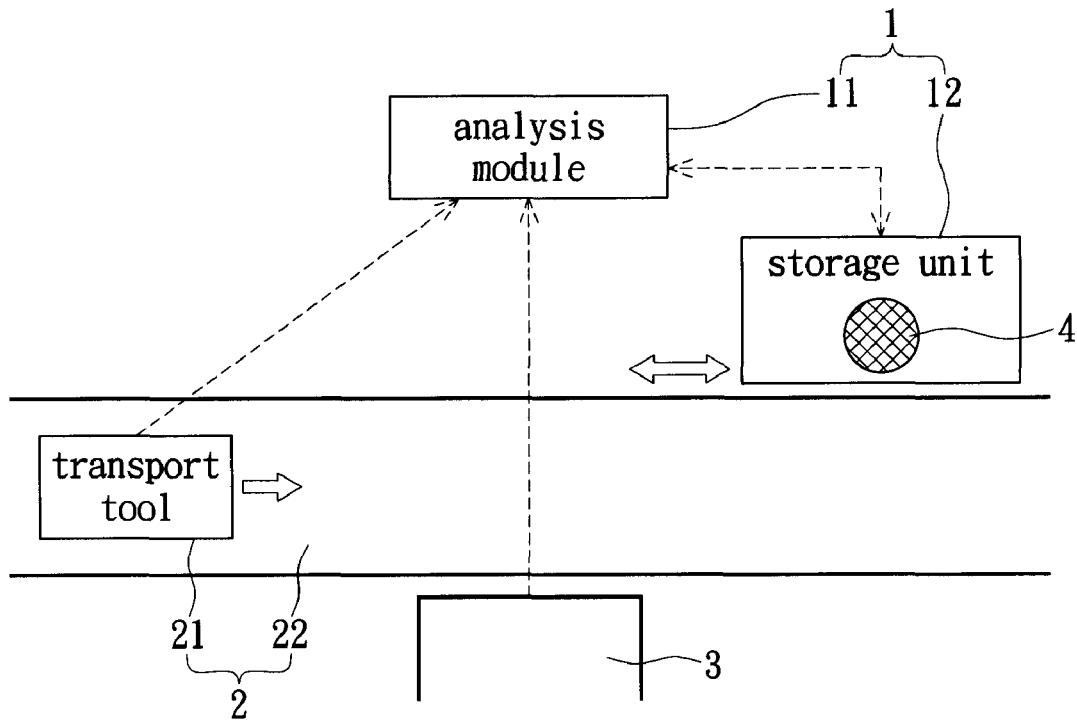
FIG. 1 is a schematic diagram of the automatic wafer storage system of the present invention.

Please refer to FIG. 1, an automatic wafer storage system is disclosed. The automatic wafer storage system 1 comprises an analysis module 11 and a storage unit 12. The automatic wafer storage system 1 is used for a transport system 2 of a semi-conductor factor. The transport system 2 comprises a transport tool 21 and a belt 22. The transport tool 21 is movably disposed on the belt 22, and the transport tool 21 moves in one direction. The belt 22 is disposed beside an equipment 3, wherein the equipment 3 is used for processing wafers. Thereby, the transport tool 21 can move on the belt 22 and carry wafers 4 to the equipment 3 for processing. In the embodiment, the transport tool 21 is an Overhead Hoist Shuttle (OHS), an Overhead Hoist Transport (OHT), or a Rail Guided Vehicle (RGV) used in semi-conductor manufacturing factory.

But the number of the transport tool 21 and the belt 22 is not limited to the above. There may be a plurality of transport tools 21 and a plurality of belts 22. The transport tools 21 are disposed movably in one direction on the belt 22. Thereby, it forms a wafers-transporting area. In the embodiment of the present invention, the number of the transport tools 21 and the belt 22 is one. The number of the transport tools 21 and the belt 22 may be designed according to a user's need.

Figure 2:
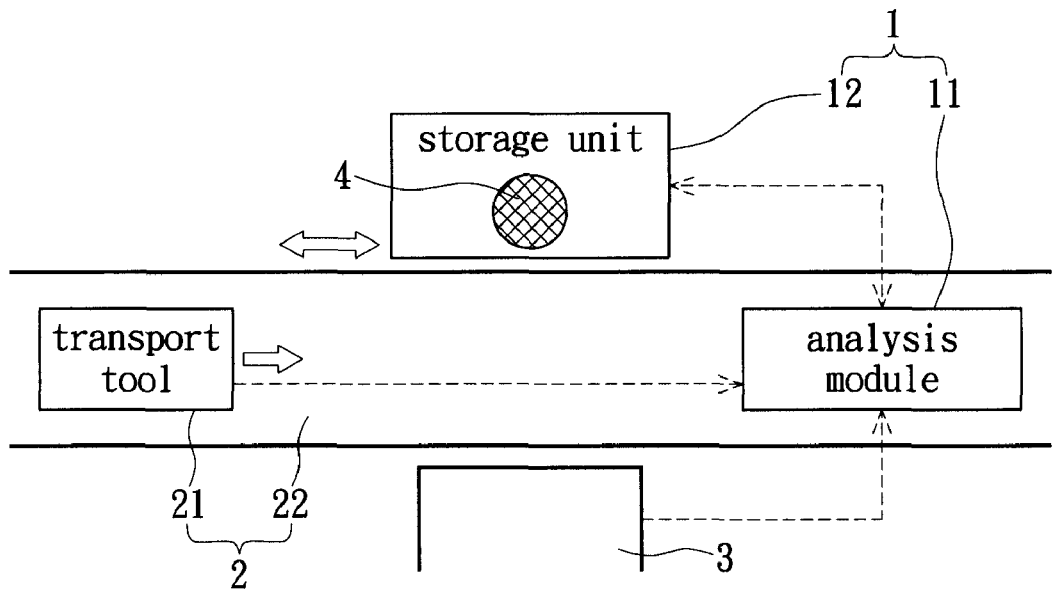
FIG. 2 is a another schematic diagram of automatic wafer storage system of the present invention.

The analysis module 11 of the automatic wafer storage system 1 is electrically connected with the transport tool 21, the equipment 3, and the storage unit 12 respectively. The analysis module 11 is for estimating the relative locations of the transport tool 21, the equipment 3, and the storage unit 12. The movement of the storage unit 12 is controlled according to the relative locations. The location of the analysis module 11 is not limited as a result of that the analysis module 11 is for analysis estimating and order controlling, not for a wafer carrying. The analysis module 11 can be discretely disposed on the belt 22 (as shown in FIG. 2) or disposed independently outside the belt 22 (as shown in FIG. 1). The way of the analysis module 11 electrically connected with the transport tool 21, the equipment 3, and the storage unit 12 is via wire connection or wireless connection.

When the equipment 3 is operating on prior wafers and is not available, the unprocessed wafers 4 are stored in the storage unit 12 and wait for an idle (i.e. available) equipment 3. The storage unit 12 is a buffer station for storing the wafers 4 for a while. In particular, the storage unit 12 is movably disposed on the belt 22 and can move in two directions. The storage unit 12 is electrically connected with the analysis module 11. The storage unit 12 not only sends a location signal to the analysis module 11, but is also controlled by the analysis module 11 and moves on the belt 22 in two directions.

Figure 3A:
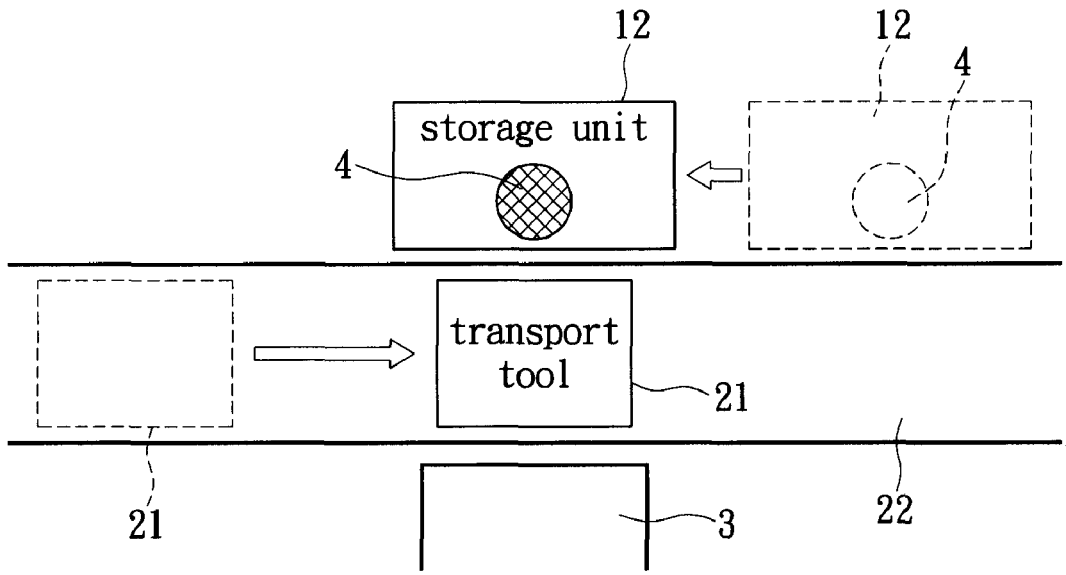
FIGS. 3A-3C is a series of operating motion schematic diagram showing the transport process of the present invention.
Figure 3B:
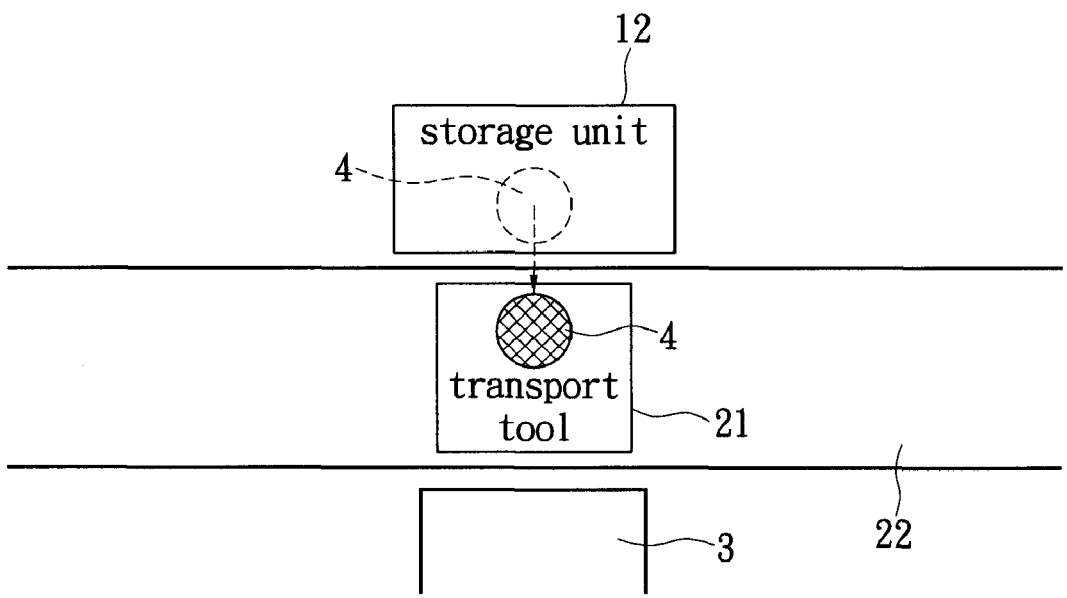
Figure 3C:
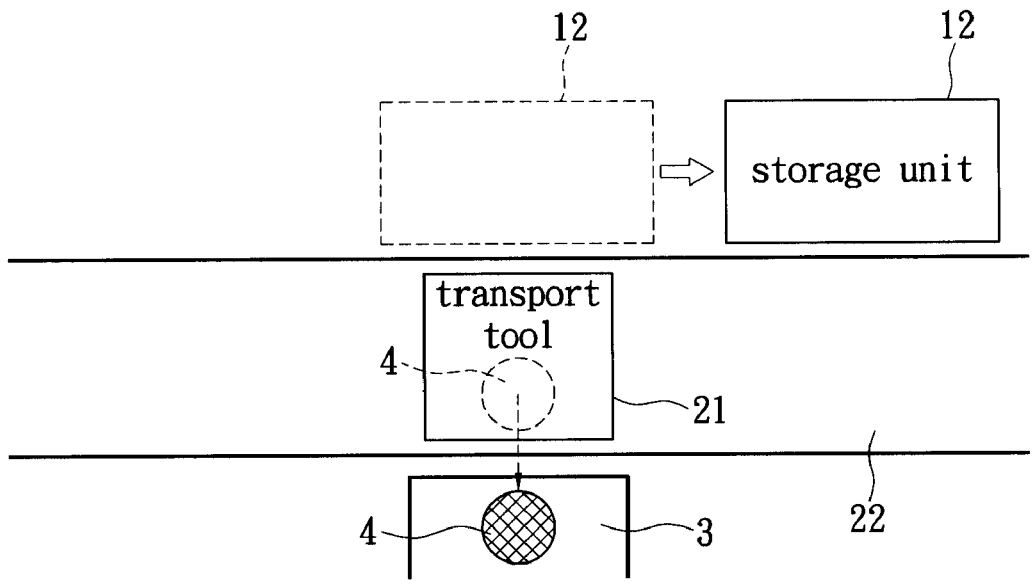
Figure 4A:
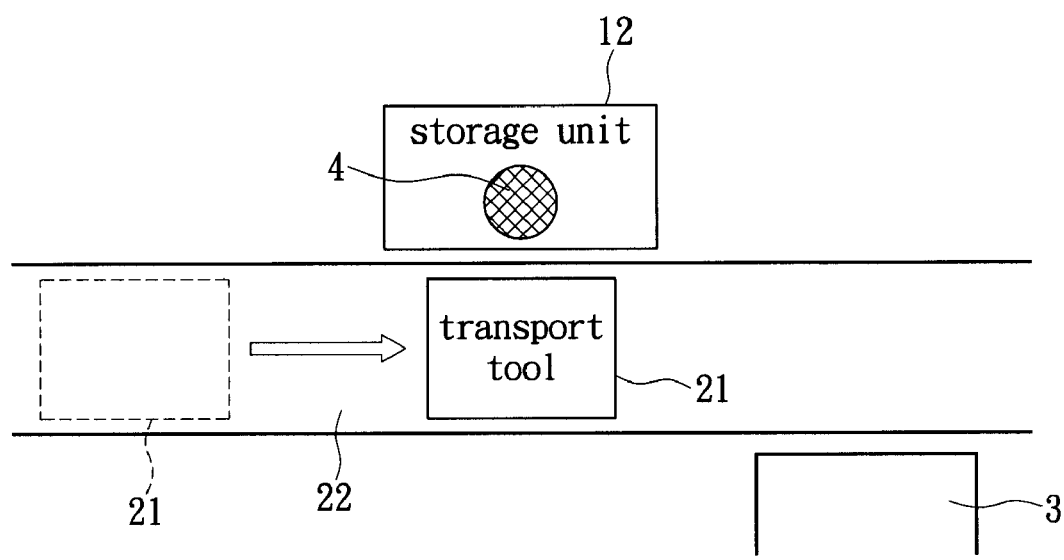
FIGS. 4A-4C is another operating motion schematic diagram showing the transport process of the present invention.
Figure 4B:
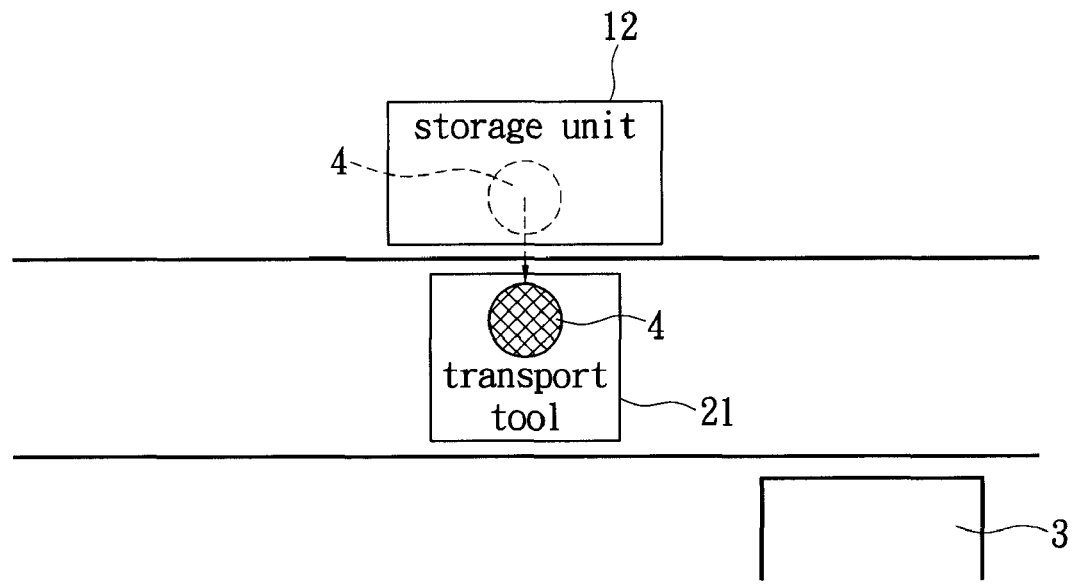
Figure 4C:
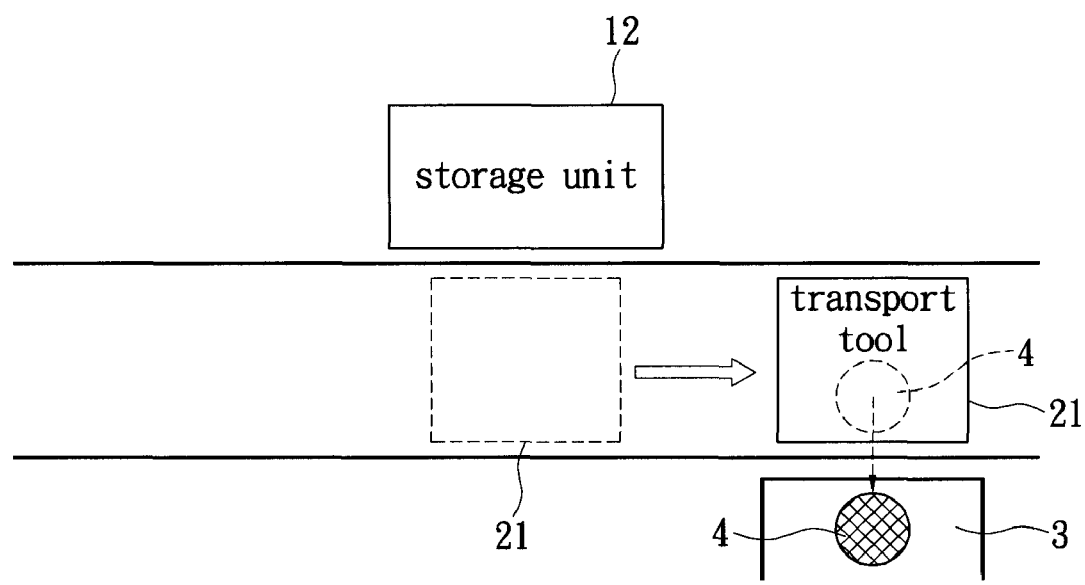

Please refer to FIGS. 3A to 3C. When the equipment 3 is idle and available, the analysis module 11 would control the storage unit 12 to move to the best location according to the relative locations of the equipment 3, the transport tool 21, and the storage unit 12. The transport tool 21 would move to the best location at the same time. At the best location, the storage unit 12 transports the wafers 4 to the transport tool 21 so that now the transport tool 21 may carry the wafers 4 and the transportation of the wafers 4 continues. The transport tool 21 then transports the wafers 4 to the idle equipment 3 for processing. The best location means the location of the idle equipment 3. Therefore, the idle equipment 3 can receive the wafers 4 to process quickly. The idle time of the equipment 3 is thereby reduced.

Figure 5:
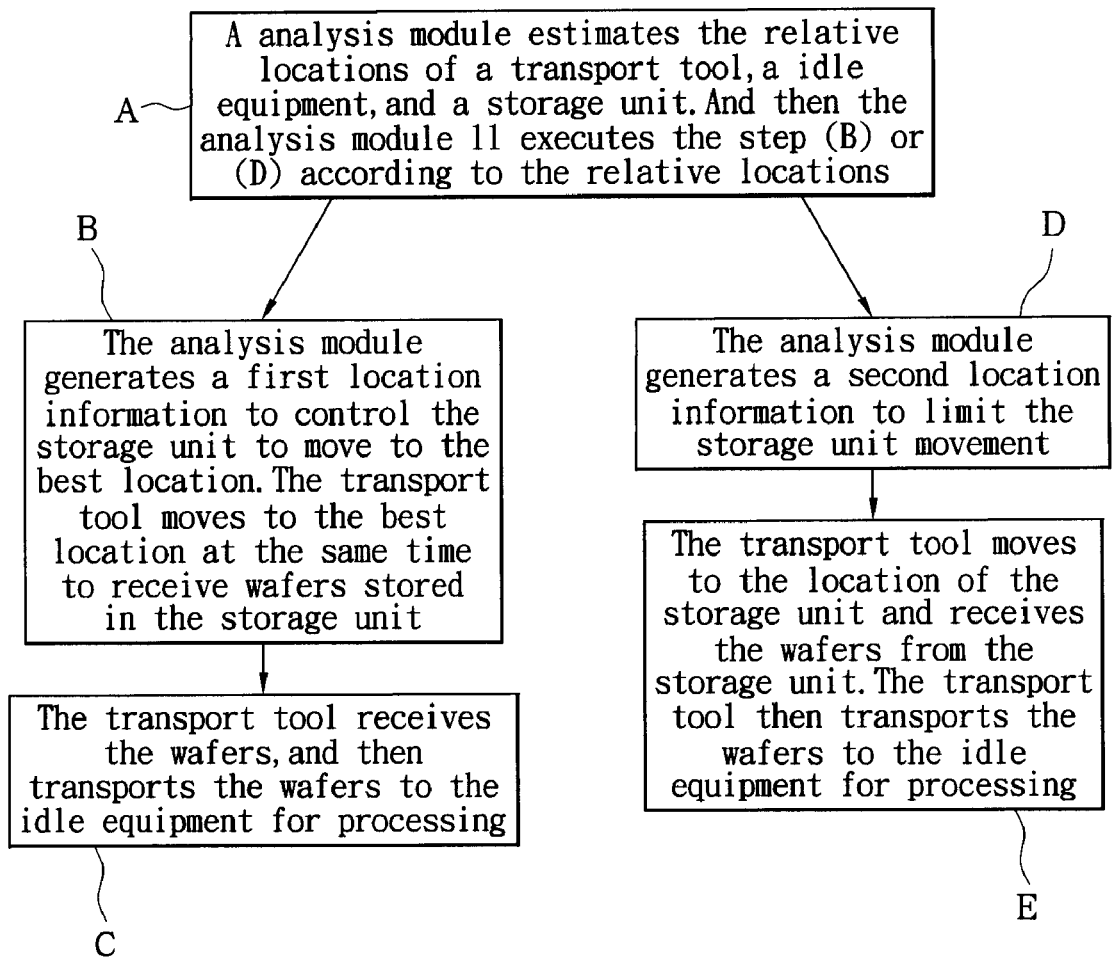
FIG. 5 is a flow chart showing a method for controlling the system.

Please refer to FIG. 5, a method for controlling the automatic wafer storage system is provided in the present invention. The steps are as follows (referring to FIGS. 3A to 4C):

(A) The analysis module 11 estimates the relative locations of the transport tool 21, the idle equipment 3, and the storage unit 12. And then the analysis module 11 executes the step (B) or (D).

(B) The analysis module 11 generates a first location information to control the storage unit 12 to move to the best location. The transport tool 21 moves to the best location at the same time to receive the wafers 4 stored in the storage unit 12. The first location information means the idle equipment 3 is between the transport tool 21 and the storage unit 12, and the transport tool 21 is moving to the idle equipment 3 (referring to FIGS. 3A to 3C).

(C) The transport tool 21 receives the wafers 4, and then transports them to the idle equipment 3 for processing.

(D) The analysis module 11 further estimates and generates a second location information to limit the storage unit 12 movement according to the relative locations of the transport tool 21, the idle equipment 3, and the storage unit 12. The second location information means the storage unit 12 is between the transport tool 21 and the equipment 3, and the transport tool 21 is moving to the idle equipment 3 (referring to FIGS. 4A to 4C).

(E) The transport tool 21 moves to the location of the storage unit 12 and receives the wafers 4 from the storage unit 12. The storage unit 12 moves back to the original location to receive a next order. The transport tool 21 then carries the wafers 4 to the idle equipment 3 for processing.

According to the above method, the automatic wafer storage system can estimates the relative locations of the idle equipment 3, the transport tool 21, and the storage unit 12 and then control the storage unit 12 to move to the best location for working with the transport tool 21. The waiting time of the wafers 4 is reduced.

Thus, the advantages of the present invention are as follows:

1. The efficiency of the transport system is increased. The transporting time of the wafer and the idle time of the equipment are reduced. The yield is improved.
2. The transport system can be used in an area. The waiting time of the wafer stored in the storage unit is reduced.
3. The storage unit of the present invention can move in two directions. The storage unit cooperates with the transport tool to transport the wafer to the idle equipment faster and due to the shortened distance.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. An automatic wafer storage system for a transport system of a semi-conductor factory, the transport system including at least one belt and at least one transport tool, the transport tool being configured to move on the belt in one direction and transport wafers to an idle equipment for processing, the automatic wafer storage system comprising:

an analysis module electrically connected to the transport system and the idle equipment configured to estimate locations of the transport tool and the idle equipment and send out a transport order indicating a predetermined location; and at least one storage unit for storing the wafers movably disposed on the belt and in electrical connection with the analysis module configured to receive the transport order and moves to the predetermined location, wherein the storage unit moves back to an original location automatically when completing the transport order to wait for a next transport order, wherein the transport tool also moves to the predetermined location and carries the wafers to the idle equipment for processing.

2. The automatic wafer storage system as claimed in claim 1, wherein the storage unit can move on the belt in two directions.

3. The automatic wafer storage system as claimed in claim 1, wherein the predetermined location is the location of the idle equipment.

4. The automatic wafer storage system as claimed in claim 1, wherein there are a plurality of automatic wafer storage systems, and the automatic wafer storage systems are used for the transport system of the semi-conductor factory respectively.

5. The automatic wafer storage system as claimed in claim 1, wherein the transport tool is an Overhead Hoist Shuttle (OHS), an Overhead Hoist Transport (OHT), or a Rail Guided Vehicle (RGV).

6. An automatic wafer storage system, the belt including at least one transport tool for transporting the wafers, the transport tool moving on the belt in one direction and carrying the wafers to an idle equipment for processing, the automatic wafer storage system comprising:

an analysis module disposed on the belt and electrically connected between the transport tool and the idle equipment; and at least one storage unit for storing the wafers movably disposed on the belt, the storage unit moves in two directions and is electrically connected with the analysis module, wherein the analysis module is configured to estimate relative locations of the transport tool, the idle equipment, and the storage unit, and control the storage unit to move to a location of the idle equipment, wherein the storage unit moves back to an original location automatically when completing the transport order to wait for a next transport order, wherein the transport tool carries the wafers which are stored in the storage unit to the idle equipment for processing.

7. The automatic wafer storage system as claimed in claim 6, wherein the transport tool is an Overhead Hoist Shuttle (OHS), an Overhead Hoist Transport (OHT), or a Rail Guided Vehicle (RGV).

8. A method for controlling an automatic wafer storage system, wherein the automatic wafer storage system is used for a transport system of a semi-conductor factory so as to transport wafers to an idle equipment, the transport system comprising at least one belt and at least one transport tool, the automatic wafer storage system comprising at least one analysis module and at least one storage unit, the method for controlling the automatic wafer storage system is as follows:

the analysis module estimating relative locations of the transport tool, the idle equipment, and storage unit;

a first location information generated from the analysis module according to the relative locations of the transport tool, idle equipment, and the storage unit for controlling the storage unit to move to the predetermined location, the transport tool also moving to the predetermined location at the same time, the storage unit transporting the wafers to the transport tool, the transport tool carrying the wafers to an idle equipment for processing; or a second location information generated from the analysis module according the relative locations of the transport tool, idle equipment, and the storage unit for limiting the storage unit movement, the transport tool moving to a location of the storage unit at the same time, the storage unit transporting wafers stored therein to the transport tool, and then the transport tool carrying the wafers to the idle equipment for processing.

9. The method for controlling the automatic wafer storage system as claimed in claim 8, wherein the transport tool is an Overhead Hoist Shuttle (OHS), an Overhead Hoist Transport (OHT), or a Rail Guided Vehicle (RGV).

10. The method for controlling the automatic wafer storage system as claimed in claim 8, wherein the transport tool and the storage unit are disposed movably on a belt.

11. The method for controlling an automatic wafer storage system as claimed in claim 10, wherein the transport tool moves along the belt in one direction.

12. The method for controlling the automatic wafer storage system as claimed in claim 10, wherein the storage unit moves along the belt in two directions.

13. The method for controlling the automatic wafer storage system as claimed in claim 8, wherein the storage unit is a buffer station for storing the wafers.

14. The method for controlling the automatic wafer storage system as claimed in claim 8, wherein the first location information that the idle equipment is between the transport tool and the storage unit, and the transport tool is moving to the idle equipment.

15. The method for controlling the automatic wafer storage system as claimed in claim 8, wherein the predetermined location is the location of the idle equipment.

16. The method for controlling an automatic wafer storage system as claimed in claim 8, wherein the second location information that the storage unit is between the transport tool and the idle equipment, and the transport tool is moving to the idle equipment.

* * * * *